United States Patent
Cao et al.

(10) Patent No.: US 9,711,614 B2
(45) Date of Patent: Jul. 18, 2017

(54) FABRICATION OF III-NITRIDE POWER DEVICE WITH REDUCED GATE TO DRAIN CHARGE

(71) Applicant: International Rectifier Corporation, El Segundo, CA (US)

(72) Inventors: Jianjun Cao, Torrance, CA (US); Sadiki Jordan, Torrance, CA (US)

(73) Assignee: Infineon Technologies Americas Corp., El Segundo, CA (US)

(*) Notice: Subject to any disclaimer, the term of this patent is extended or adjusted under 35 U.S.C. 154(b) by 0 days.

(21) Appl. No.: 14/789,027

(22) Filed: Jul. 1, 2015

(65) Prior Publication Data
US 2015/0380518 A1 Dec. 31, 2015

Related U.S. Application Data

(62) Division of application No. 12/009,045, filed on Jan. 16, 2008, now Pat. No. 9,076,852.

(60) Provisional application No. 60/881,405, filed on Jan. 19, 2007.

(51) Int. Cl.
| | |
|---|---|
| H01L 21/00 | (2006.01) |
| H01L 29/74 | (2006.01) |
| H01L 29/66 | (2006.01) |
| H01L 29/20 | (2006.01) |
| H01L 29/423 | (2006.01) |
| H01L 29/778 | (2006.01) |
| H01L 21/02 | (2006.01) |
| H01L 21/321 | (2006.01) |
| H01L 29/205 | (2006.01) |

(52) U.S. Cl.
CPC .... *H01L 29/66462* (2013.01); *H01L 21/0254* (2013.01); *H01L 21/3212* (2013.01); *H01L 29/2003* (2013.01); *H01L 29/205* (2013.01); *H01L 29/4232* (2013.01); *H01L 29/7786* (2013.01)

(58) Field of Classification Search
CPC ............. H01L 29/2003; H01L 29/7787; H01L 2924/0002; H01L 29/66462; H01L 29/7786
See application file for complete search history.

(56) References Cited

U.S. PATENT DOCUMENTS

| | | | | |
|---|---|---|---|---|
| 6,593,194 B2* | 7/2003 | Kolodzey | ......... | H01L 21/28202 257/E21.441 |
| 2004/0061129 A1* | 4/2004 | Saxler | ................. | H01L 29/7787 257/192 |
| 2005/0258451 A1* | 11/2005 | Saxler | ................. | H01L 29/7787 257/192 |
| 2006/0148182 A1* | 7/2006 | Datta | ................ | H01L 29/66871 438/289 |
| 2007/0158692 A1* | 7/2007 | Nakayama | .......... | H01L 29/4236 257/213 |
| 2010/0155779 A1* | 6/2010 | Murase | ............... | H01L 29/7787 257/192 |

* cited by examiner

*Primary Examiner* — Bradley K Smith
*Assistant Examiner* — David Goodwin
(74) *Attorney, Agent, or Firm* — Murphy, Bilak & Homiller, PLLC

(57) ABSTRACT

A III-nitride power switch that includes a III-nitride heterojunction, field dielectric bodies disposed over the heterojunction, and either gate conductive bodies that do not overlap the top surface of the field dielectric bodies or power contacts that do not overlap field dielectric bodies or both.

5 Claims, 2 Drawing Sheets

US 9,711,614 B2

FABRICATION OF III-NITRIDE POWER DEVICE WITH REDUCED GATE TO DRAIN CHARGE

RELATED APPLICATION

This is a divisional of application Ser. No. 12/009,045 filed Jan. 16, 2008, which itself claims priority to U.S. provisional application Ser. No. 60/881,405, filed Jan. 19, 2007. The disclosures in the above-referenced patent applications are hereby incorporated fully by reference into the present application.

FIELD OF THE INVENTION

This present invention relates to III-nitride type power switching devices and more specifically relates to a III-nitride power switch with a reduced $Q_{GD}$ and a process for the fabrication thereof.

DEFINITION

III-nitride refers to a semiconductor alloy from the InAlGaN system. Examples of III-nitride semiconductors are GaN, AlGaN, AlN, InAlGaN, InGaN, InN, or any combination thereof.

BACKGROUND AND SUMMARY OF THE INVENTION

Referring to FIG. 1, a known III-nitride power semiconductor device includes III-nitride multilayer body 21 formed on a substrate 20. Substrate 20 is preferably formed of silicon, but may be formed of SiC, Sapphire or a III-nitride semiconductor such as GaN. Multilayer body 21 includes a III-nitride active heterojunction 21A. Active heterojunction 21A includes III-nitride barrier layer 21B (e.g. AlGaN) formed on a III-nitride channel layer 21C (e.g. GaN). As is well known, the thickness and composition of barrier layer 21B and channel layer 21C are selected so that a two-dimensional electron gas (2DEG) is formed in channel layer 21C close to the heterojunction of layer 21B and layer 21C. The current in the device is conducted through the 2DEG. Note that III-nitride multilayer 21 may include a III-nitride transition layer (e.g. formed with AlN), and a III-nitride buffer layer (e.g. GaN layer) disposed between substrate 20 and heterojunction 21A, when for example, substrate 20 is non-native (i.e. is not from the III-nitride semiconductor system) to the III-nitride system. For example, when silicon is used as a substrate material.

A device as described above further includes a first power electrode 30 (e.g. source electrode) coupled ohmically to heterojunction 21B and second power electrode 30' (e.g. drain electrode) coupled ohmically to heterojunction 21A whereby current may be conducted between electrode 30, 30' through the 2DEG. A gate dielectric body 27 is disposed over heterojunction 21A through which gate conductive body 35 can be capacitively coupled to the 2DEG in order to interrupt (depletion mode) or restore (enhancement mode) the same depending on the type of device.

The device further includes field dielectric bodies 25. Each field dielectric is disposed between a power electrode 30, 30' and gate conductive body 35. As illustrated field dielectric body 25 is thicker than gate dielectric 27. Gate conductive body 35 extends over a field dielectric body 25.

Note that each electrode 30, 30' also rises along adjacently disposed field dielectric bodies 25 and over a portion thereof.

In the device shown by FIG. 1, overlap of the gate metal (a) over dielectric 25 contributes to gate to drain charge (Qgd). The overlap (b) of the ohmic electrodes 30 over dielectric 25 increases pitch size.

In a III-nitride device according to the present invention, either the overlap of gate metal or the overlap of ohmic metal over the field dielectric bodies, or both, are eliminated through, for example, a chemical mechanical polishing (CMP) step. As a result, $Q_{GD}$ of the device may be improved, and also the cell pitch of the device may be improved.

BRIEF DESCRIPTION OF THE PREFERRED EMBODIMENTS

Figure 1:
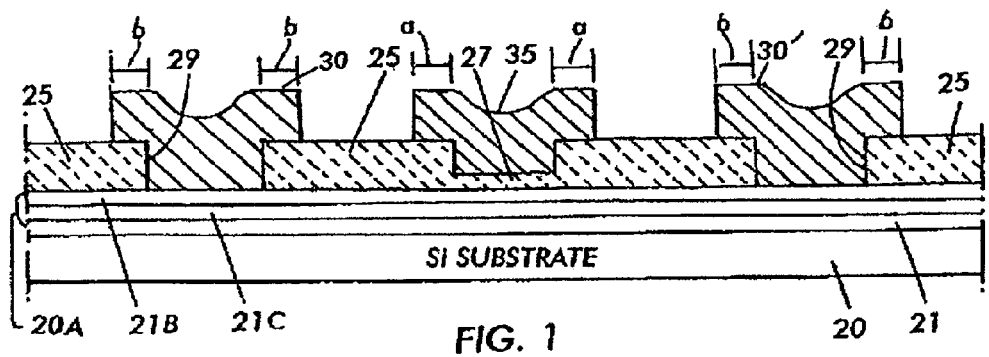
FIG. 1 illustrates a cross-section of a III-nitride device according to the prior art.
Figure 2:
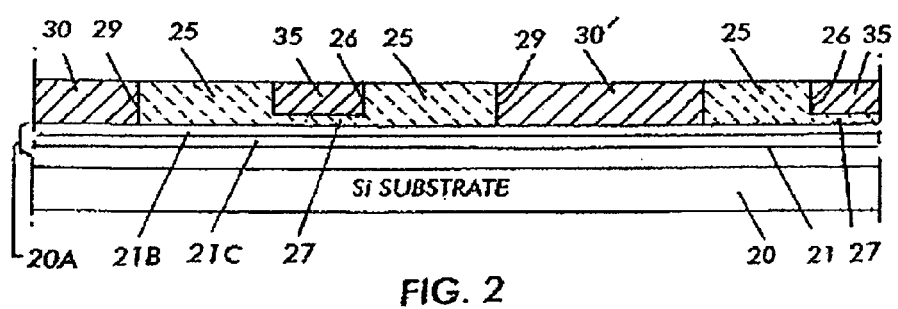
FIG. 2 illustrates a first preferred embodiment of the present invention in which the ohmic contacts and gate contact terminate in the plane of the top of the field dielectric layer.

Referring to FIG. 2, in which like numerals identify like features as discussed above, a III-nitride power switch according to the first embodiment of the present invention includes gate conductive body 35 that does not overlap the top surface of adjacently disposed field dielectric bodies 25. Preferably, gate conductive body 35 includes a top surface that is coplanar with top surfaces of adjacently disposed field dielectric bodies 25. As a result, a device according to the first embodiment may exhibit a reduced $Q_{GD}$ value.

Furthermore, in a device according to the first embodiment power electrodes 30, 30' do not overlap the top surface of adjacently disposed field dielectric bodies 25. As a result, the cell pitch of a device according to the first embodiment may be reduced, which in turn allows for reduction of $R_{DSON}$ of the device by allowing a greater number of active cells per unit area.

Figure 3:
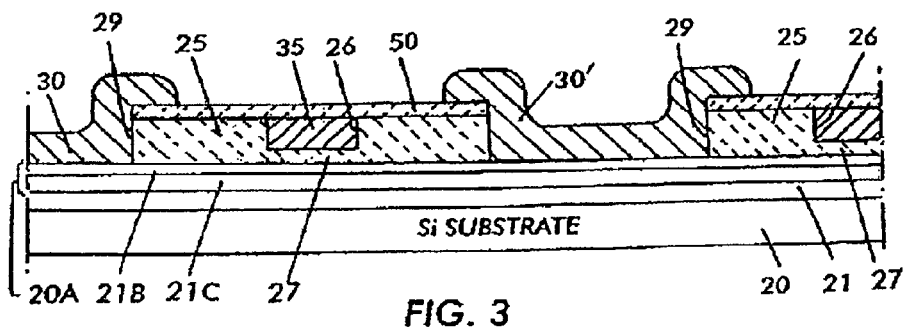
FIG. 3 shows a second embodiment of a device according to the present invention.

Referring now to FIG. 3, in which like numerals identify like features, a III-nitride switch according to the second embodiment of the present invention includes gate conductive body 35 that does not overlap the top surface of adjacently disposed field electric bodies 25 (and preferably includes a top surface coplanar with top surfaces of field dielectric bodies 25), while power electrodes 30, 30' overlap the top surface of adjacently disposed field dielectric bodies. Note that in a device according to the second embodiment, an etch stop layer 50 can be disposed above gate conductive body 35 after the planarization thereof to protect dielectric bodies 25 and gate conductive body 35 during the fabrication of power contacts 30, 30'.

Figure 4:
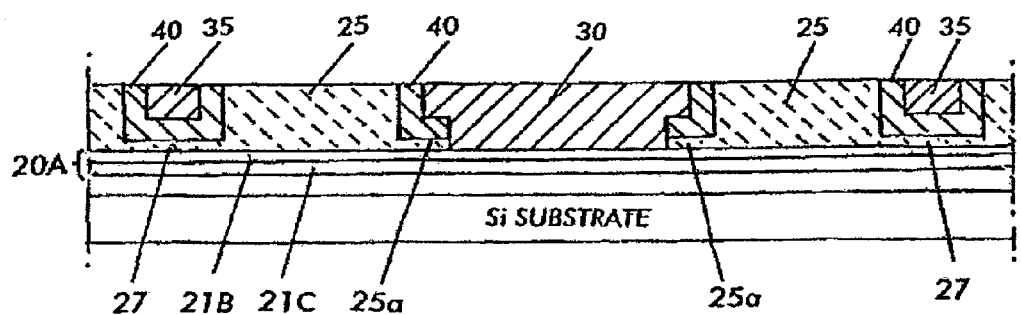
FIG. 4 shows a third embodiment of the invention.

Referring to FIG. 4, in which like numerals identify like features, a device according to the third embodiment also includes gate conductive bodies 35 that do not overlap the top surfaces of adjacently disposed field dielectric bodies (and preferably include top surfaces coplanar with the top surfaces of adjacently disposed field dielectric bodies 25), and at least one power contact 30 that does not overlap the top surface of adjacently disposed field dielectric bodies 25. Note that a device according to the third embodiment includes barrier bodies 40 disposed under gate conductive bodies 35, and at least on opposing sides of power contact 30. The application of barrier bodies 40 is disclosed in U.S. patent application Ser. No. 11/702,727, entitled III-nitride Semiconductor Device, filed Feb. 6, 2007, assigned to the assignee of the present application, the entire content of which is incorporated by this reference. Note that a device according to the third embodiment includes dielectric lips 25 under barrier bodies 40 that are adjacent to power contact 30. According to the present invention, barrier bodies 40 also do not overlap the top surface of adjacently disposed field dielectric bodies 25, and are preferably coplanar with adjacently disposed field dielectric bodies 25.

Figure 5:
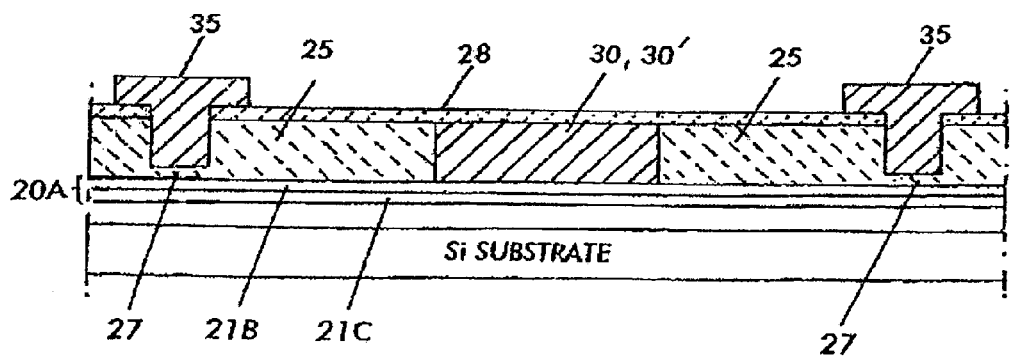
FIG. 5 shows a fourth embodiment of the present invention.

Referring now to FIG. 5, in which like numerals identify like features, in a device according to the first embodiment of the present invention, power contacts 30, 30' (note that only one power contact is shown for simplicity) do not overlap the top surface of adjacently disposed dielectric bodies 25 (and include preferably top surfaces coplanar with top surfaces of adjacently disposed field dielectric bodies 25), while conductive gate bodies 35 overlap the top surface of adjacently disposed field dielectric bodies 25. Note that an etch stop layer 28 can be applied atop power contacts 30, 30' after the planarization thereof according to the present invention, to protect power contacts 30, 30' and field dielectric bodies 25 during the fabrication of gate conductive bodies 35.

To fabricate a device according to the present invention, an epitaxially deposited III-nitride multilayer structure 21 is built atop substrate 20, using any desired method. Structure 21 includes at least one III-nitride heterojunction having a two-dimensional electron gas (2DEG) to serve as a conductive channel. For example, structure 21 includes a heterojunction between a GaN layer and an AlGaN layer that produces a 2DEG layer (not shown) which permits conduction between a source and a drain contact, under the control of a gate structure. Note that substrate 20 may be preferably a silicon wafer, but may also be a SiC wafer, Sapphire wafer, or a III-nitride wafer such as a GaN wafer, without deviating from the scope and the spirit of the invention.

Next, a field dielectric layer 25 is formed atop layer 21 and an active mask step is employed to etch windows 26 in the field dielectric layer 25. A thin gate dielectric layer 27 is then formed at the bottom of windows 26.

Thereafter, conductive gate metal are deposited inside openings 26 and patterned to obtain gate conductive bodies 35 inside windows 26 over gate dielectric bodies 27. Preferably, in the same step, windows 29 are opened in field dielectric bodies 25 for the reception of contact metal. Next, contact metal is deposited inside windows 29, and thereafter, in a chemical mechanical polishing (CMP) step, the excess metal is removed until at least the top surface of field dielectric bodies is reached. As a result, a III-nitride device is obtained according to the first embodiment that includes gate conductive bodies 35 and power contacts 30, 30' that do not overlap the top surface of adjacently disposed field dielectric bodies 25.

Note that a rapid thermal appeal (RTA) can be applied after the CMP step or before the CMP step. A typical RTA is carried out at 800° C. to 900° C. for 30 seconds to 120 seconds. Thereafter, other features such as gate, source, and drain routing can be fabricated according to any desired method.

To fabricate a device according to the third embodiment, a device can be fabricated as set forth in U.S. application Ser. No. 11/702,727, and then subjected to a CMP step according to the present invention. Thus, the fabrication of a device according to the third embodiment may include the deposition or otherwise the formation of a barrier body 46 after the gate dielectric deposition.

To fabricate a device according to the second embodiment, after the deposition of a gate metal, a CMP step is applied to obtain a gate conductive body 35 that does not overlap adjacently disposed field dielectric bodies. Thus, the CMP stops at least at the top surface of field dielectric bodies 25. Thereafter, a thin layer of oxide or nitride is deposited atop field dielectric bodies 25 and conductive gate bodies 35 to serve as an etch stop layer 50. Next, field dielectric bodies 25 are patterned to include windows 29 for the reception of contact metal. Next, contact metal is deposited and patterned to obtain power contacts 30, 30' according to the second embodiment.

To fabricate a device according to the fourth embodiment, field dielectric layer 25 is first patterned to include windows 29 for the reception of power contacts 30, 30', contact metal is deposited, and according to the present invention a CMP step is applied to remove the contact metal. The CMP preferably stops at the top surface of field dielectric bodies 25, whereby power contacts 30, 30' are obtained that do not overlap adjacently disposed field dielectric bodies. Next, an etch stop layer 28 (e.g. an oxide or a nitride layer) is applied atop field dielectric bodies 25 and the planarized power contacts 30, 30'. Thereafter, windows 26 are opened in the field dielectric layer, gate dielectric 27 is deposited at the bottom of windows 26, and gate metal is deposited inside windows 26 and patterned to obtain gate conductive bodies 35 as illustrated by FIG. 5. Note that etch stop layer 28 prevents damage to field dielectric bodies 25 and power contacts 30, 30' during the patterning of gate metal to obtain gate conductive bodies 35.

Field dielectric 25 can be a silicon nitride, or silicon oxynitride, or a metal oxide such as $Al_2O_3$, $HfO_2$, at a thickness of 500 Å to 5000 Å. Gate dielectric 27 can be silicon nitride or a metal oxide such as $SiO_2$, $Al_2O_3$, $HfO_2$, $TiO_2$ at a thickness of 20 Å to 500 Å.

The contact metal 30, 30' include Ti and Al and capping layers such a Ni/Au, Mo/Au, Ti/TiW, Ti/TiN.

It should be noted that each III-nitride power semiconductor device according to the present invention includes a III-nitride multilayer body 21 formed on a substrate 20. Substrate 20 is preferably formed of silicon, but may be formed of SiC, Sapphire or a III-nitride semiconductor such as GaN. Multilayer body 21 includes a III-nitride active heterojunction 21A. Active heterojunction 21A includes III-nitride barrier layer 21B (e.g. AlGaN) formed on a III-nitride channel layer 21C (e.g. GaN). The thickness and composition of barrier layer 21B and channel layer 21C are selected so that a two-dimensional electron gas (2DEG) is formed in channel layer 21C close to the heterojunction of layer 21B and layer 21C. The current in the device is conducted through the 2DEG. Note that III-nitride multilayer 21 may include a III-nitride transition layer (e.g. formed with AlN), and a III-nitride buffer layer (e.g. GaN layer) disposed between substrate 20 and heterojunction 21A, when for example, substrate 20 is non-native (i.e. is not from the III-nitride semiconductor system) to the III-nitride system. For example, when silicon is used as a substrate material.

First power electrode 30 (e.g. source electrode) is preferably coupled ohmically to heterojunction 21B and second power electrode 30' (e.g. drain electrode) is preferably coupled ohmically to heterojunction 21A whereby current may be conducted between electrode 30, 30' through the 2DEG. Gate conductive body 35 can be capacitively coupled to the 2DEG through gate dielectric body 27 in order to interrupt (depletion mode) or restore (enhancement mode) the same depending on the type of device.

Each field dielectric body 25 is disposed between a power electrode 30, 30' and gate conductive body 35. As illustrated field dielectric body 25 is thicker than gate dielectric 27. Note that each power electrode 30, 30' also rises along adjacently disposed field dielectric bodies 25.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A method for fabricating a III-nitride semiconductor switch, said method comprising:
   forming a III-nitride heterojunction;
   forming a field dielectric layer over said III-nitride heterojunction;
   etching a window inside said field dielectric;
   depositing a conductive body inside said window such that said conductive body fills said window and overlaps with a top surface of said field dielectric outside of said window;
   removing said conductive body that overlaps with said top surface of said field dielectric such that said conductive body is only disposed inside said window; and
   covering said top surface of said field dielectric and said conductive body inside said window with an etch stop layer, patterning said field dielectric to form another window therein, and depositing another conductive body inside said another window.

2. The method of claim 1, wherein said conductive body is removed using CMP.

3. A method for fabricating a III-nitride semiconductor switch, said method comprising:
   forming a III-nitride heterojunction;
   forming a field dielectric layer over said III-nitride heterojunction;
   etching a window inside said field dielectric;
   depositing a conductive body inside said window such that said conductive body fills said window and overlaps with a top surface of said field dielectric outside of said window;
   removing said conductive body that overlaps with said top surface of said field dielectric layer such that said conductive body is only disposed inside said window; and
   etching another window in said field dielectric after depositing said conductive body, and depositing another conductive body in said another window prior to removing said conductive body such that said another conductive body fills said another window and overlaps with a top surface of said field dielectric outside of said another window.

4. The method of claim 3, wherein removing said conductive body also removes said another conductive body that overlaps with said top surface of said field dielectric outside of said another window such that said another conductive body is only disposed inside said another window.

5. The method of claim 4, wherein said removing comprises a CMP step.

* * * * *